United States Patent [19]

Yamaguchi et al.

[11] Patent Number: 5,157,016

[45] Date of Patent: Oct. 20, 1992

[54] METHOD FOR PRODUCING A SUPERCONDUCTING ARTICLE

[75] Inventors: Takeshi Yamaguchi; Hideo Itozaki; Shuji Yazu; Tetsuji Jodai, all of Hyogo, Japan

[73] Assignee: Sumitomo Electric Industries, Ltd., Osaka, Japan

[21] Appl. No.: 729,888

[22] Filed: Jul. 11, 1991

Related U.S. Application Data

[63] Continuation of Ser. No. 524,703, May 17, 1990, abandoned, which is a continuation of Ser. No. 237,034, Aug. 29, 1988, abandoned.

[30] Foreign Application Priority Data

Aug. 28, 1987 [JP] Japan ................. 62-214440

[51] Int. Cl.$^5$ ............................................. B05D 5/12
[52] U.S. Cl. ..................................... 505/1; 505/704; 505/736; 427/62
[58] Field of Search .................... 505/1, 704, 736; 427/62, 63; 419/19, 20; 75/234, 235

[56] References Cited

U.S. PATENT DOCUMENTS 3,932,315  1/1976  Sleight ......................... 251/521
4,826,808  5/1989  Yurek et al. ....................... 505/1

FOREIGN PATENT DOCUMENTS 60-173885  9/1985  Japan .

OTHER PUBLICATIONS

Maeda et al., "A new high-Tc oxide superconductor without a rare earth element", Jpn. J. Appl. Phys., vol. 27(2) Feb. 1988, L209-210.

Sheng et al., "New 120K Tl-Ca-Ba-Cu-O Superconductor", Appl. Phys. Lett. 52(20) May, 1988, P1738-1740.

Masumoto et al., Asahi Newspaper, Mar. 10, 1987.

Yurek et al., "Direct Synthesis of a Metal/Superconducting Oxide Composite by Oxidation of a Metallic Precursor", J. Electrochem. Soc., vol. 134(10), Oct. 1987, p. 2635.

Gruen et al., "Formation of Perovskite Surface Layers by Oxidation of Cu-La-Sr Alloys", J. Electrochem. Soc., vol. 134(6), Jun., 1987, pp. 1588-1589.

Matsuzaki et al., "Preparation of a high Tc superconductor by oxidation of an amorphous $La_{1.8}Sr_{0.2}Cu$ Alloy Ribbon in Air" Jpn. J. Appl. Phys., vol. 26(4), Apr. 1987, L334.

Japanese Journal of Applied Physics/Part 2: Letters, vol. 26, No. 8, Aug. 1987, Tokyo, Japan, L1310-L1312, K. Matsuzaki et al.: "High Tc-Superconductor Prepared by Oxidation of a Liquid-Quenched Yb1Ba2Cu3 Alloy Foil in Air", p. L1310, paragraph 2.

Applied Physics Letters, vol. 51, No. 7, 17 Aug. 1987, pp. 538-539, N.Y., U.S., R. Haldar et al.: "EuBa2Cu3Ox produced by oxidation of a rapidly solidified precursor alloy: An alternative preparation method for high Tc ceramic superconductors", whole document.

Patent Abstracts of Japan, vol. 6, No. 230 (E-142)(1108), 16 Nov. 1982; & JP-A-57132381 (Nippon Denshin Denwa) Aug. 16, 1982, Abstract Figure.

Advanced Ceramic Materials-Ceramic Superconductors, vol. 2, No. 3B, Jul. 1987, pp. 388-400, Westerville, Ohio, U.S., R. W. McCallum et al., "Problems in the production of YBa2Cu3Ox superconducting wire".

Shimbun, Yomiuri, "An Epoch-Making Superconducting Material", Feb. 16, 1987, Evening Edition (English translation).

Bednorz, et al., "Possible High $T_c$ Superconductivity in the Ba-La-Cu-O System", Z. Phys. B-Condensed Matter 64, (1986), pp. 189-193.

*Primary Examiner*—Shrive Beck
*Assistant Examiner*—Roy V. King
*Attorney, Agent, or Firm*—Foley & Lardner

[57] ABSTRACT

A method for producing a superconducting article. An alloy consisting of metal elements, such as Y, Ba and Cu which are constituent elements of a superconducting compound oxide to be produced is oxidized so that a surface of the alloy is converted to the superconducting compound oxide such as $YBa_2Cu_3O_{7-\delta}$.

13 Claims, No Drawings

METHOD FOR PRODUCING A SUPERCONDUCTING ARTICLE

This application is a continuation of application Ser. No. 07/524,703, filed May 17, 1990, which is a continuation of application Ser. No. 07/237,034, filed Aug. 29, 1988, both now abandoned.

BACKGROUND OF THE INVENTION

1. Field of the Invention

The present invention relates to a method for producing a superconducting article such as a superconducting wire. More particularly, it relates to a novel method for producing a superconducting article comprising a core body composed of an alloy and a surface layer composed of a superconducting material supported or surrounding on the core body.

2. Description of the Related Art

Under the superconducting condition, the electric resistance becomes zero and perfect diamagnetism is observed. Thus, under the superconducting condition, electric current of a very high current density can be delivered without any loss of power.

Realization of superconducting coils which permit generation of a very high magnetic field is expected to accelerate development in the field of fusion power generation as well as in the field of MHD power generation or motor-generators. The development of superconducting coils is also in demand other industrial fields such as electric power reservation system; transportation systems such as magnetic levitation trains or magnetically propelling ships; medical appliances such as a high-energy beam radiation unit; or scientific instruments such as NMR.

In addition to the abovementioned electric power applications, the superconducting materials can be used in the field of electronics, for example, as a device using the Josephson effect in which quantum efficiency is observed macroscopically when an electric current is passed through a weak junction arranged between two superconductors. A tunnel junction type Josephson device which is a typical application of the Josephson effect is expected to be a high-speed and low-power consuming switching device owing to smaller energy gap of the superconducting material. It is also expected to utilize the Josephson device as high sensitive sensors or detectors for sensing very weak magnetic fields, microwaves, radiant rays or the like since variation of electromagnetic waves or magnetic fields is reflected in variation of Josephson effect and can be observed as a quantum phenomenon precisely. Development of the superconducting devices is also demand in the field of high-speed computers in which the power consumption per unit area is reaching the upper limit of the cooling capacity with increment of the integration density in order to reduce energy consumption.

However, the critical temperature could not exceed 23.2 K. of $Nb_3Ge$ which was the highest Tc for the past ten years.

The possibility of an existence of new types of superconducting materials having much higher Tc was revealed by Bednorz and Müller, who discovered a new oxide type superconductor in 1986 [Z. Phys. B64 (1986) 189].

It had been known that certain ceramic materials of compound oxides exhibit the property of superconductivity. For example, U.S. Pat. No. 3,932,315 dicloses Ba-Pb-Bi type compound oxide which shows superconductivity and Japanese patent laid-open No. 60-173,885 discloses that Ba-Bi type compound oxides also show superconductivity. These superconductors, however, possess rather lower transition temperatures of about 10 K. and hence usage of liquidized helium (boiling point of 4.2 K.) as cryogen is indispensable to realize superconductivity.

The new type compound oxide superconductor discovered by Bednorz and Müller is represented by [La, Sr]$_2$CuO$_4$ which is called the K$_2$NiF$_4$-type oxide having a crystal structure which is similar to known perovskite type oxides. The K$_2$NiF$_4$-type compound oxides show such higher Tc as 30 K., which are extremely higher than known superconducting materials.

It was also reported that C. W. Chu et al discovered, in the United States of America, another superconducting material so called YBCO type represented by YBa$_2$Cu$_3$O$_{7-x}$ having the critical temperature in the order of 90 K. in February 1987. Still other types of new superconducting materials which were reported recently are a compound oxide of Bi-Sr-Ca-Cu-O system and Tl-Ba-Ca-Cu-O system which exhibit such high Tc as more than 100 K. and which are chemically much more stable than the abovementioned YBCO type compound oxide or the like.

Hence, the possibility of an existence of high-temperature superconductors have burst onto the scene.

However, these new type superconducting materials are ceramic materials of compound oxides which do not possess such a high plasticity as well-known metal type superconducting materials such as Ni-Ti alloy. In fact, they are produced by a sintering technique in which a compact of powder material is sintered in a furnace. However, the sintered articles are fragile and easily brake even under a very weak mechanical stress, so that they can not or are difficult to be shaped or deformed into a desired shape such as a wire by the conventional plastic deformation techniques. In order to realize a reliable and practical superconducting structure, it is indispensable that the structure possesses enough strength and tenacity which is sufficient to endure bending force during usage.

Taking the abovementioned situation into consideration, the present inventors have proposed a process for manufacturing a ceramic wire by the steps comprising filling a metal pipe with a material powder of ceramic, performing plastic deformation of the metal pipe filled with the ceramic metal powder to reduce the cross section of the metal pipe, and then subjecting the deformed metal pipe to heat-treatment to sinter the ceramic material powder in the metal pipe in the United States of America patent application Ser. No. 152,713 and Ser. No. 161,480 which are commonly assigned and now abandoned, Ser. No. 182,489 and Ser. No. 189,366, now U.S. Pat. No. 5,122,507.

These solutions are themselves satisfactory but the present inventors have continued to develop another process which can produce the superconductor of compound oxide more simply and completed the present invention.

Therefore, an object of the present invention is to provide a new and simple method for manufacturing a superconductor.

SUMMARY OF THE INVENTION

The present invention provides a method for producing a superconducting article, characterized by the steps comprising preparing an alloy consisting of metal elements which are constituent elements of a superconducting compound oxide to be produced, and then oxidizing a surface of the alloy so that the surface of the alloy is converted to the compound oxide of the metal elements which have a superconducting property.

DETAILED DESCRIPTION OF THE PREFERRED EMBODIMENT

The term "an alloy consisting of metal elements which are constituent elements of a superconducting compound oxide" means such a metallurgical mixture as composed of all elements of a superconducting compound oxide to be produced except oxygen, in other words, an alloy of metal elements of the superconducting compound oxide to be produced. For instance, in a case that a surface layer of a superconducting compound oxide of Y-Ba-Cu-O system is produced, an alloy consisting of Y-Ba-Cu is used. For La-Ba-Cu-O system and La-Sr-Cu-O system, alloys consisting of La-Ba-Cu and La-Sr-Cu are used respectively. An atomic ratio of these metal elements in the alloy should be adjusted to a value which corresponds to an atomic ratio of these metal elements in the compound oxide to be produced on the surface of the alloy.

Since these metal elements posses metallic properties, the alloy of these metal elements can be prepared by any one of the conventional metallurgical techniques for producing metal alloys which are well-known. For example, an alloy of Y-Ba-Cu for producing a surface layer of a compound oxide of Y-Ba-Cu-O system is prepared as following:

At first, commercially available metal powders of yttrium, barium and copper are mixed with an atomic ratio of Y:Ba:Cu=1:2:3 in ethanol in non-oxidative atmosphere or under vacuum. The resulting mixture of metal powders is melted at a temperature which is higher than 1,000° C. This stage of fusion of metal elements is carried out in non-oxidative atmosphere or under vacuum in order to prevent oxidation of the metal elements which will deteriorate mechanical strength of the resulting alloy.

The alloy thus obtained possess properties as a metal, so that alloy can be shaped into a desired configuration such as a wire, a stripe, a band, a coil, a rod, a yoke or the like by any one of the conventional metal workings such as wire drawing technique, press molding or forging or the like. For example, a rod or a bar is cut out of an ingot which is produced by casting molten alloy thus obtained and is drawn through a wire-drawing machine into a shape of a wire or a tape which will be used as a core body in the next stage.

According to the present invention, a surface of the core body of the alloy thus obtained is oxidized so that the surface of alloy is converted to an oxide of the metal elements. The oxidation of the surface of the alloy can be effected by any one of known oxidizing techniques. For example, the alloy is heated by means of laser beam, high-frequency waves, oxidizing flame or the like in an oxidative atmosphere to produce a compound oxide layer on a surface of the alloy. The oxidation of the surface of the alloy can be effected also by oxygen ion beam bombarding or doping techniques in a vacuum chamber as well as by means of oxidizing agents. In a case of an elongated article such as a wire or a tape, the oxidation can be carried out continuously. The oxidation of alloy must be effected to such a manner that a layer of compound oxide having a certain depth is produced on a surface of the alloy.

The resulting product according to the present invention comprises a core body consisting of alloy which possess metallic properties and an outer oxide layer which has a superconducting property. Thus, the core body of the alloy functions as a support for the outer oxide layer.

As the compound oxide which can be prepared by the present invention, the following systems of compound oxides are mentioned:

(1) a compound oxide represented by the general formula:

$$\alpha_w \beta_x \gamma_y O_z$$

in which $\alpha$ stands for an element selected from IIa group of the Periodic Table, $\beta$ stands for at least one of elements selected from IIIa group of the Periodic Table, and $\gamma$ stands for an element selected from a group comprising Ib, IIb, IIIb, IVa and VIIIa groups of the Periodic Table and w, x, y and z satisfy respective ranges of $1 \leq w \leq 5, 1 \leq x \leq 5, 1 \leq y \leq 15, 1 \leq z \leq 20$. The element $\alpha$ is preferably Ba or Sr, the element $\beta$ is preferably at least one element selected from a group comprising Y, La, Gd, Dy, Ho, Er, Tm, Yb, Nd, Sm, Eu and Lu and the element $\gamma$ is preferably Cu. The other elements selected from a group comprising Al, Fe, Co, Ni, Zn, Ag and Ti can be added to the system in addition to the elements $\alpha$, $\beta$ and $\gamma$.

Selection of the atomic ratio between $\alpha$ and $\beta$ depend on a combination of these elements and is preferably made in the following range:

| | |
|---|---|
| Y/(Y + Ba): | 0.06 to 0.94, preferably 0.1 to 0.4 |
| Ba/(La + Ba): | 0.04 to 0.96, preferably 0.08 to 0.45 |
| Sr/(La + Sr): | 0.03 to 0.95, preferably 0.05 to 0.1 |

In a preferred system, the element $\alpha$ is Ba, the element $\beta$ is at least one element selected from a group comprising Y, La, Gd, Dy, Ho, Er, Tm, Yb, Nd, Sm, Eu and Lu and the element $\gamma$ is Cu and an atomic ratio of Ba:$\beta$:Cu is 2:1:3. In this system, the converted compound oxide of the metal elements which is formed on the surface of the alloy is represented by the general formula:

$$Ln_1 Ba_2 Cu_3 O_{7-\delta}$$

in which Ln stands for at least one element selected from a group comprising Y, La, Gd, Dy, Ho, Er, Tm, Yb, Nd, Sm, Eu and Lu and $\delta$ satisfies a range of $0 < \delta < 1$.

Thus, the preferable compound oxides are Y-Ba-Cu-O system including the following special cases:

| | | |
|---|---|---|
| $Y_1Ba_2Cu_3O_{7-\delta}$, | $Ho_1Ba_2Cu_3O_{7-\delta}$, | $Lu_1Ba_2Cu_3O_{7-\delta}$, |
| $Sm_1Ba_2Cu_3O_{7-\delta}$, | $Nd_1Ba_2Cu_3O_{7-\delta}$, | $Gd_1Ba_2Cu_3O_{7-\delta}$, |
| $Eu_1Ba_2Cu_3O_{7-\delta}$, | $Er_1Ba_2Cu_3O_{7-\delta}$, | $Dy_1Ba_2Cu_3O_{7-\delta}$, |
| $Tm_1Ba_2Cu_3O_{7-\delta}$, | $Yb_1Ba_2Cu_3O_{7-\delta}$, | $La_1Ba_2Cu_3O_{7-\delta}$, | in which x is a number which satisfies a range of $0 < x < 1$.

The above-mentioned compound oxides preferably possess perovskite type or quasi-perovskite type crystal structure. The term quasi-perovskite type means a structure which can be considered to have such a crystal structure that is similar to perovskite-type oxides and includes an orthorhombically distorted perovskite or a distorted oxygen-deficient perovskite or the like.

(2) a compound oxide represented by the general formula:

$$(M, Sr)_2CuO_{4-\delta}$$

in which M stands for Y or La and $\delta$ satisfies a range of $0 < \delta < 1$.

(3) a compound oxide represented by the general formula:

$$(\alpha_{1-x}\beta_x)Cu_yO_z$$

in which $\alpha$ and $\beta$ are defined as noted supra, x is an atomic ratio of $\beta$ with respect to $(\alpha + \beta)$ and has a range of $0.1 \leq x \leq 0.9$, and y and z are respective atomic ratios with respect to $(\alpha_{1-x}\beta_x)$ which is considered to be equal to 1 and each satisfies ranges of $0.4 \leq y \leq 3.0$ and $1 \leq z \leq 5$ respectively.

(4) a compound oxide represented by the general formula:

$$\Theta_4(\phi_{1-q} \cdot Ca_q)_m Cu_n O_{p-r}$$

in which $\Theta$ stands for Bi or Tl, $\phi$ stands for Sr when $\Theta$ is Bi and stands for Ba when $\Theta$ is Tl, m and n are numbers each satisfying a range of $6 \leq m \leq 10$ and $4 \leq n \leq 8$ respectively, $p = (6 + m + n)$, q is a number which satisfies a range of $0 < q < 1$, and r is a number which satisfies a range of $-2 \leq r \leq +2$. This system is considered to be a single phase of the following compound oxide or a mixed phase consisting mainly thereof:

| | |
|---|---|
| $Bi_4Sr_4Ca_4Cu_6O_{20-r}$ | $Bi_2Sr_2Ca_2Cu_3O_{10-r}$ |
| $Tl_4Ba_4Ca_4Cu_6O_{20-r}$ | $Tl_2Ba_2Ca_2Cu_3O_{10-r}$ | in which r is a number which satisfies a range of $-2 \leq r \leq +2$.

When a surface layer of a compound oxide of Bi-Sr-Ca-Cu-O system is prepared, an alloy consisting of Bi, Sr, Ca and Cu with an atomic ratio of Bi:Sr:Ca:Cu = 2:2:2:3 is preferably used and when a surface layer of a compound oxide of Tl-Ba-Ca-Cu-O system is prepared, an alloy consisting of Tl, Ba, Ca and Cu with an atomic ratio of Tl:Ba:Ca:Cu = 2:2:2:3 is preferably used.

According to the method of the present invention, the resulting article has a compound oxide layer which possesses the superconducting property on a surface of a core body of alloy which functions as a mechanical support and a by-pass of electric current when the superconductivity breaks.

The superconducting article obtained is advantageously usable in the field of electric circuits which control electric signals precisely.

Now, an embodiment of the method according to the present invention will be described by Example, but the scope of the present invention should not be limited thereto.

EXAMPLE 1

Commercially available metal powders of yttrium, barium and copper are mixed with an atomic ratio of Y:Ba:Cu = 1:2:3 in ethanol in nitrogen gas atmosphere. The resulting mixture of metal powders is melted in a platinum crucible at a temperature which is higher than 1,500° C. for 2 hours in vacuum.

From the resulting alloy, three wires (sample No. 1, 2 and 3) each having a length of 30 cm and a diameter of 2 mm, 3 mm and 5 mm respectively are prepared by means of roller dies and then is heated at 950° C. for 5 hours in an oxygen atmosphere of 1 atm. After the heat-treatment is completed, the wires are cooled down slowly at a cooling rate of 10° C./min.

After electrodes are connected on a surface of each wire with a silver paste, the wire is immersed in liquidized helium and then the temperature is arisen gradually to measure the temperature dependency of the superconductivity. Electric resistance is determined by common four probe method and the temperature is determined by a calibrated Au(Fe)Ag thermocouple.

The result is summarized in Table 1.

TABLE 1

| Sample No. (Diameter) | Tc (K) | Tci (K) |
|---|---|---|
| 1 (2 mm) | 96 | 87 |
| 2 (3 mm) | 101 | 94 |
| 3 (5 mm) | 98 | 92 |

Note:
Tc: the critical temperature of superconductivity.
Tci: the terminal point of the phase transition where the perfect zero resistance is realized.

We claim:
1. A method for producing a superconducting article made of copper-containing metal alloy that functions as a bypass of electric current in an emergency and having a superconducting copper-containing surface layer composed of a superconducting copper-containing compound oxide, consisting essentially of the steps of:
   preparing a metal powder mixture of constituent metal elements of the superconducting copper-containing compound oxide except for oxygen,
   melting the metal powder mixture at a temperature which is higher than 1,000° C. to produce a core of copper-containing metal alloy, and
   oxidizing a surface of said core of copper-containing metal alloy to such an extent that an outer surface of said core of metal alloy is converted to a superconducting copper-containing compound oxide composed of the constituent metal elements and oxygen to produce a superconducting surface layer while a core of copper-containing metal alloy remains which functions as a bypass of electric current when there is a break in the superconducting surface layer.

2. The method according to claim 1, wherein the oxidation of the surface of said core of metal alloy is effected by heating the outer surface of said core of metal alloy in an oxidative atmosphere.

3. The method according to claim 1, wherein the oxidation of the surface of said core of metal alloy is effected by irradiating the outer surface of said core of metal alloy with a laser beam in the presence of oxygen.

4. The method according to claim 1, wherein the oxidation of the surface of said core of metal alloy is effected by irradiating the outer surface of said core of metal alloy with high-frequency waves in the presence of oxygen.

5. The method according to claim 1, wherein the oxidation of the surface of said core of metal alloy is effected by irradiating the outer surface of said core of metal alloy with oxygen ion beam bombardment in a vacuum chamber.

6. The method according to claim 1, wherein the oxidation of the surface of said core of metal alloy is effected by burning the outer surface of said core of metal alloy with an oxidizing flame.

7. The method according to claim 1, wherein said superconducting article has a form of an elongated shape.

8. The method according to claim 1, wherein said core of metal alloy consists of metal elements comprising Ba, at least one element selected from Y, La, Gd, Dy, Ho, Er, Tm, Yb, Nd, Sm, Eu, Lu and Cu, and wherein said compound oxide formed on the surface of said core of metal alloy is a compound oxide represented by the general formula:

$$Ln_1Ba_2Cu_3O_{7-\delta}$$

in which Ln stands for at least one element selected from a group comprising Y, La, Gd, Dy, Ho, Er, Tm, Yb, Nd, Sm, Eu and Lu, and δ satisfies a range of $0 < \delta < 1$.

9. The method according to claim 1, wherein said core of metal alloy consists of Sr, Y or La, and Cu and wherein said compound oxide formed on the surface of said core of metal alloy is a compound oxide represented by the general formula:

$$(M, Sr)_2CuO_{4-\delta}$$

in which M stands for Y or La, and δ satisfies a range of $0 < \delta < 1$.

10. The method according to claim 1, wherein said core of metal alloy consists of Bi, Sr, Ca and Cu having the atomic ratios of Bi:Sr:Ca:Cu of 2:2:2:3, and wherein said compound oxide formed on the surface of said core of metal alloy is a compound oxide represented by the general formula:

$$Bi_4(Sr_{1-q} \cdot Ca_q)_m Cu_n O_{p+r}$$

in which "m" and "n" are numbers each satisfying a range of $6 \leq m \leq 10$ and $4 \leq n \leq 8$, respectively, $p = (12 + m + n)$, q is a number which satisfies a range of $0 < q < 1$, and r is a number which satifies a range of $-2 \leq r \leq +2$.

11. The method according to claim 1, wherein said core of metal alloy consists of Tl, Ba, Ca and Cu having the atomic ratios of Tl:Ba:Ca:Cu of 2:2:2:3, and wherein said compound oxide formed on the surface of said core of metal alloy is a compound oxide represented by the general formula:

$$Tl_4(Ba_{1-q} Ca_q)_m Cu_n O_{p+r}$$

in which "m" and "n" are numbers each satisfying a range of $6 \leq m \leq 10$ and $4 \leq n \leq 8$, respectively, $p = (12 + m + n)$, q is a number which satisfies a range of $0 < q < 1$, and r is a number which satisfies a range of $-2 \leq r \leq +2$.

12. A method for producing a superconducting article having a core of metal alloy consisting of Y, Ba and Cu that functions as a bypass of electric current in an emergency and a superconducting compound oxide layer formed on an outer surface of said core, consisting essentially of the steps of:

preparing a metal powder mixture Y, Ba and Cu having atomic ratios of Y:Ba:Cu of 1:2:3, melting the metal powder mixture at a temperature which is higher than 1,500° C. in a vacuum to produce said core of metal alloy of Y, Ba and Cu, and oxidizing a surface of said core of metal alloy of Y, Ba and Cu at 950° C. for more than 5 hours in an oxygen gas atmosphere of 1 atm so that an outer surface of said core of metal alloy of Y, Ba and Cu is converted to a compound oxide represented by the general formula:

$$Y_1Ba_2Cu_3O_{7-\delta}$$

in which δ satisfies a range of $0 < \delta < 1$.

13. The method according to claim 12, wherein the oxidized core is cooled slowly at a cooling rate of 10° C./min.

* * * * *